(12) United States Patent
Ahmed et al.

(10) Patent No.: US 10,365,535 B2
(45) Date of Patent: Jul. 30, 2019

(54) BROADBAND FLAT OPTICAL ELEMENTS AND METHODS OF MANUFACTURE

(71) Applicant: Intel Corporation, Santa Clara, CA (US)

(72) Inventors: Khaled Ahmed, Anaheim, CA (US); Richmond Hicks, Aloha, OR (US)

(73) Assignee: Intel Corporation, Santa Clara (*) Notice: Subject to any disclaimer, the term of this patent is extended or adjusted under 35 U.S.C. 154(b) by 10 days.

(21) Appl. No.: 15/846,065

(22) Filed: Dec. 18, 2017

(65) Prior Publication Data

US 2019/0033683 A1    Jan. 31, 2019

(51) Int. Cl.
| | |
|---|---|
| G02F 1/29 | (2006.01) |
| F21V 8/00 | (2006.01) |
| C23C 16/455 | (2006.01) |
| C23C 16/24 | (2006.01) |
| B29C 65/14 | (2006.01) |
| B29C 65/70 | (2006.01) |
| B29L 11/00 | (2006.01) |
| G09G 3/32 | (2016.01) |
| G09G 3/34 | (2006.01) |

(52) U.S. Cl.
CPC .......... *G02F 1/293* (2013.01); *B29C 65/1406* (2013.01); *B29C 65/70* (2013.01); *C23C 16/24* (2013.01); *C23C 16/45525* (2013.01); *G02B 6/003* (2013.01); *B29L 2011/00* (2013.01); *G09G 3/32* (2013.01); *G09G 3/3413* (2013.01); *G09G 2320/0626* (2013.01); *G09G 2370/16* (2013.01)

(58) Field of Classification Search
CPC ... G02F 1/293; G02B 6/003; C23C 16/45525; C23C 16/24; B29C 65/1406; B29C 65/70; G09G 3/32
See application file for complete search history.

*Primary Examiner* — Jack Dinh
(74) *Attorney, Agent, or Firm* — Green, Howard, & Mughal LLP.

(57) ABSTRACT

Flat optical elements including a multi-level metasurface stack having two or more metasurface levels. Each metasurface level includes an arrangement of nanostructures, or protrusions, of one or more optically transmissive materials. A metasurface level may further include another optically transmissive material between the nanostructures, achieving a desired index contrast. Another metasurface level including additional nanostructures may be over a planar surface of this additional transmissive material. Another optically transmissive material may be between the additional nanostructures. This architecture may be followed for any number of levels, (e.g., a bi-layer, tri-layer, etc.). Each metasurface within the multi-level metasurface structure may be tuned to a particular optical wavelength. Such a multi-level metasurface may have greater bandwidth and/or achieve higher optical efficiency for a given band than a single metasurface. Molding techniques may be employed in metasurface fabrication to reduce the starting material cost and fabrication cost.

28 Claims, 12 Drawing Sheets

BROADBAND FLAT OPTICAL ELEMENTS AND METHODS OF MANUFACTURE

BACKGROUND

Optical devices that guide light along an optical path are found in many consumer and industrial applications. One application that is currently an area of significant interest is Augmented reality (AR) device technology. Examples of AR device technology include augmented reality headsets. For such platforms, it may be desirable to have a display device that provides red-green-blue (RGB) colors (e.g., full color) in a very compact package.

Optical elements redirect light as it is conveyed along a platform's optical path. The power efficiency of a display device, for example, may be improved through the design of the optical elements that convey the light from a source to a display screen or viewport. Optical elements may expand or reduce light emitted from the source to best match etendue of another component, for example. Refractive optical elements are relatively large. A typical micro convex lens may have a thickness of around 5 mm, for example. The use of conventional refractive optical elements may therefore constrain scaling of optical devices.

Flat optical elements can be much thinner than conventional optical elements. For example, flat lenses having thicknesses of only tens or hundreds of nanometers (nm) have recently been developed. A flat lens is therefore substantially two-dimensional, and can yield diffraction-limited optical performance. FIG. 1A illustrates a system 100 employing a flat lens 110. As shown, flat lens 110 includes a metasurface 120. Metasurface 120 includes a plurality of surface structures spatially arrayed over a substrate 315. Substrate 315 is typically polished quartz, or another material having similar flatness. These nanostructures may also be referred to as nanoantennas because they are each capable of functioning as a resonant optical antenna, which allows metasurface 120 to manipulate optical wave-fronts. For example, metasurface 120 may induce a phase delay, which may be precisely tuned over a footprint of the array. The controlled phase delay redirects light 105 transmitted through flat lens 110 to a focal point 180. Metasurfaces therefore provide opportunities to realize virtually flat, aberration-free optics in form factors much smaller than those required by geometrical optics.

While flat optical elements can be tuned for specific wavelengths of light by changing the size, shape or spatial layout of the nanostructures, a given design will work perfectly (i.e., be diffraction limited) for only the target wavelength. Hence, flat lens 100 will have a different focal length for different wavelengths. As further illustrated in FIG. 1B, metasurface 120 redirects light 106 of multiple wavelengths to multiple focal points 180, 185 and 190. The three different focal points are a result of light 106 having three different wavelengths with the difference in focal distance between focal points 180, 185 and 190 being a function of the bandwidth of light 106. Depending on the design of the metalens, and the material characteristics, longer wavelengths may have a shorter focal length, or they may be engineered to have a longer focal length. Regardless, incident light of a wider band will converge over a wider range of focal distances. As such, optical power outside of a given wavelength may be lost as a result of chromatic aberration in optical elements employing metasurfaces. It would be advantageous if optical elements employing metasurfaces could be made more suitable for optical platforms employing broadband light. Such broadband, flat optical elements may, for example, enable a significant reduction in the form factor of AR devices that operate over the visible light band. It would also be advantageous to reduce the cost of fabricating optical elements employing metasurfaces, whether narrowband or broadband.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
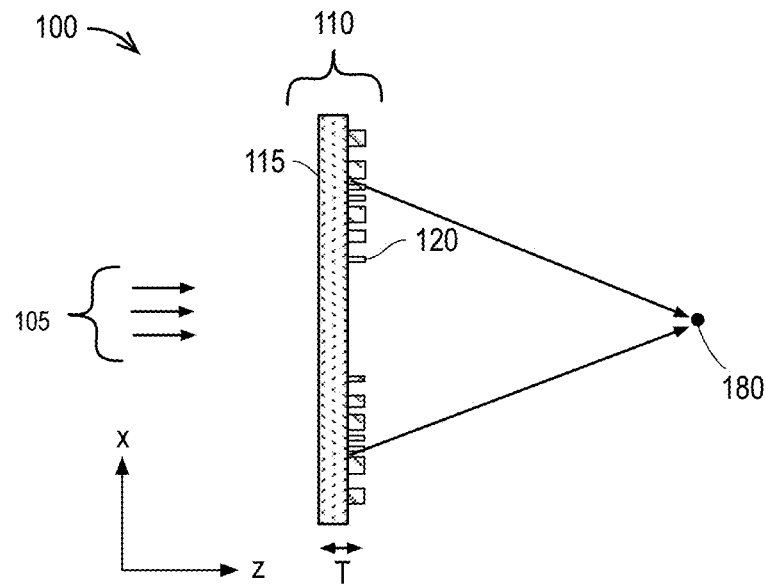
FIG. 1A is a schematic of a conventional flat lens system, employing a metasurface in accordance with convention.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Multi-level flat optical elements are described herein. Optical elements, such as, but not limited to, converging lenses, diverging lenses, filters (e.g., dichroic), integrators, diffusers, and polarizers may include a multi-level, or multi-layered, metasurface structure. As used herein, a multi-level metasurface structure has two or more metasurface levels in a stack over a substrate. In accordance with some advantageous embodiments, each metasurface within the multi-level metasurface structure may be tuned to a particular optical wavelength. One or more of the metasurfaces may then redirect light of multiple wavelengths incident to the multi-leveled metasurface. As such a multi-leveled metasurface structure may have wider bandwidth and/or achieve higher optical efficiency than an optical element employing single metasurface.

Advantageously, a multi-level metasurface structure may employ materials of relatively low refractive index, while providing wavelength-selective redirection of light. In some exemplary embodiments where light incident to a flat optical element is in the visible part of optical spectrum, each metasurface of a multi-level metasurface structure selectively redirects a subset of wavelengths while being predominantly transmissive of other wavelengths. Each metasurface level includes a spatial arrangement of nanostructures, or protrusions, of one or more optically transmissive materials. A metasurface level may further include another optically transmissive interface material between (and over) the nanostructures, achieving a desired index contrast (Δ). Another metasurface level including another spatial arrangement of nanostructures may be over a planar surface of the interface material. Another optically transmissive material may be between (and over) the second nanostructures. This level architecture may be adhered to over any number of levels, (e.g., a bi-layer, tri-layer, etc.).

Notably, mass-production of metasurfaces, particularly larger than 1 mm in diameter, can be challenging and flat optical element manufacture has yet to prove cost competitive with refractive optical element manufacture. For example, a one inch diameter precision plastic refractive lens may sell for $1-$5 per lens. However, materials such as quartz are the most common substrate material used in metasurface fabrication reliant upon photolithography. For suitable flatness, a double-sided polished quartz substrate may cost $3, or more, per square inch. For some embodiments described further below, metasurface fabrication entails metasurface molding, which may significantly reduce both the starting material cost and the cost of flat optical elements. As also described below, such methods may be further applied to manufacture broadband elements having multi-level metasurface structures.

Figure 2:
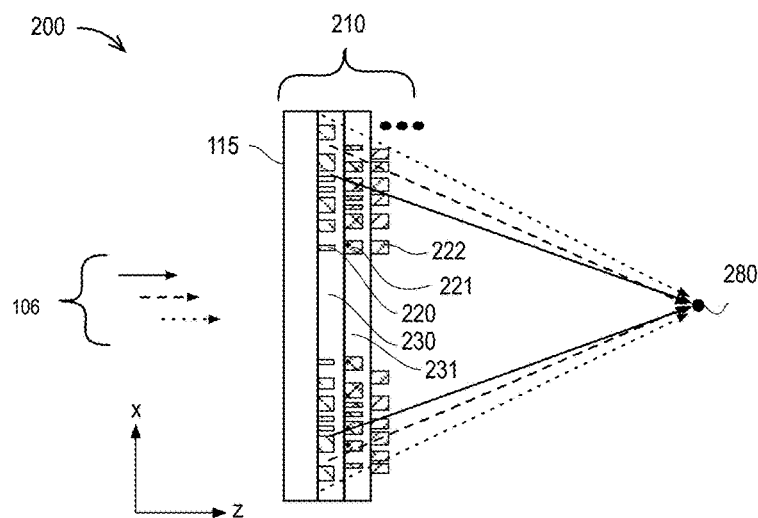
FIG. 2 is a schematic of a wideband flat lens system, employing a multi-level metasurface in accordance with some embodiments.

FIG. 2 is a schematic of a broadband flat lens system 200, employing a multi-level metasurface structure 210 in accordance with some embodiments. As shown, system 200 includes light source 106. In some embodiments, light source 106 is a wideband, chromatic source that emits light over a band that spans a few hundred to tens of hundreds of nanometers. Substrate 315 is again transmissive of light from source 106. Light transmitted through substrate 315 passes into a first metasurface level of metasurface structure 210 that includes a metasurface 220, and a metasurface interface material 230. Both metasurface 220 and interface material 230 are transmissive of light from source 106. Metasurface 220 includes an array of nanostructures spatially arranged over a footprint of substrate 315. In some embodiments, parameters of metasurface 220 are tuned to interact most strongly with light having a first center wavelength (and some first sub-band of the wavelengths emitted by source 106 surrounding the first center wavelength). Metasurface 220 may therefore selectively redirect some wavelengths of light to a greater extent than other wavelengths of light. Interface material 230 is over metasurface 220, surrounding and planarizing the nanostructures. Light transmitted through the first metasurface level enters a second metasurface level of metasurface structure 210. This second metasurface level includes another metasurface 221, and another metasurface interface material 231. Both metasurface 221 and interface material 231 are transmissive of light from source 106. Metasurface 221 similarly includes an array of nanostructures spatially arranged over a footprint of substrate 315 (and over metasurface 220). In some embodiments, parameters of metasurface 221 are tuned to interact most strongly with light having one or more second center wavelengths (and some other sub-band of the wavelengths emitted by source 106 surrounding the second center wavelength).

Interface material 231 is over metasurface 221. Interface material 231 surrounds the nanostructures and planarizes another level of metasurface structure 210. Light transmitted through the second metasurface level enters a third metasurface level of metasurface structure 210. This third metasurface level includes another metasurface 222. Optionally, another metasurface interface material may surround nanostructures of metasurface 222 in a manner substantially similar to interface materials 221 and 231. Alternatively, as shown in FIG. 2, metasurface 222 may have a free surface such that the index contrast associated with metasurface 222 is based, in part, on the refractive index of air (or any other medium in which multi-level metasurface structure 210 resides). Metasurface 222 is again transmissive of light from source 106 and includes an array of nanostructures spatially arranged over a footprint of substrate 115 (and over metasurfaces 220 and 221). In some embodiments, parameters of metasurface 222 are tuned to interact most strongly with light having one or more third center wavelength (and another sub-band of the wavelengths emitted by source 106 surrounding the third center wavelength). As represented by the ellipses in FIG. 2, any number of additional levels may be further included in metasurface structure 210, as a matter of design choice.

Figure 1B:
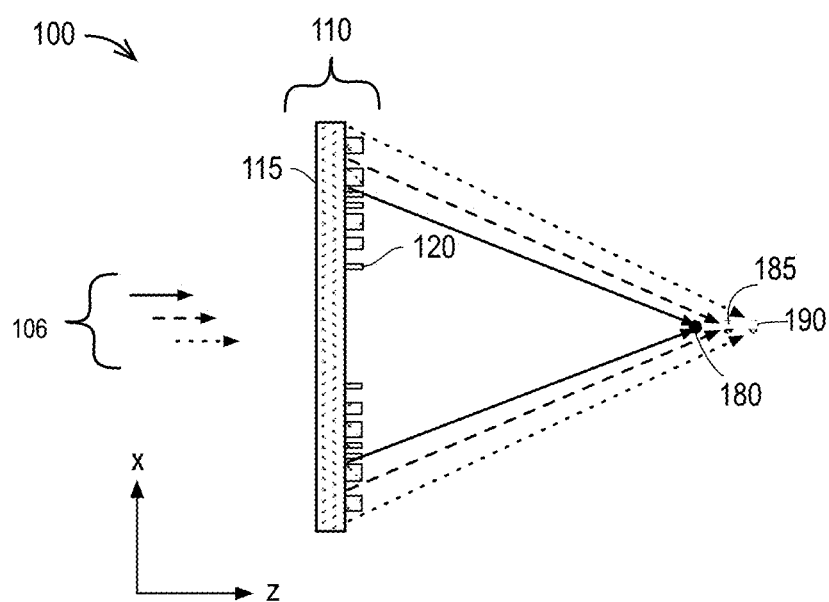
FIG. 1B is a schematic illustrating a narrow band limitation of the conventional flat lens system illustrated in FIG. 1A.

As further shown in FIG. 2, with levels of metasurface structure 210 appropriately tuned, light from source 106 may converge substantially at a single focal point 280. Convergence of light from light source 106 may therefore be superior to that of system 100 (FIG. 1B), reducing chromatic aberration and improving overall optical efficiency of the flat lens. Metasurface structure 210 may be considered a monolithic stack of metasurface lenses (with only one substrate). Metasurface lenses within the stack may interact to some extent, for example if sub-bands of incident light are resonant with more than one metasurface level. In that case, lensing by one metasurface level may be compounded with lensing of another. With multiple metasurface levels, flat lens design may therefore entail optimization across the multiple levels of the metasurface structure 210. Parameters of each metasurface level may be tuned in view of the other metasurface levels so that their cumulative effect is optimized for minimum chromatic aberration. For example, where metasurface 220 is tuned for some center wavelength while metasurface 221 is tuned for another (longer or short) center wavelength, parameters of both metasurface 220 and 221 may each be tuned in view of the other (and to further complement metasurface 222, etc.) such that light spanning a band including the center wavelengths is redirected appropriately upon exiting all levels of metasurface structure 210. In addition to tuning a metasurface level for a unique center wavelength, aberrations such as chromatic dispersion may be tuned over the multiple levels. In addition to tuning each metasurface level to complement the others included in a multi-leveled structure, any given level may employ a metasurface that has been mixed (i.e., includes nanostructures dimensioned for two or more different center wavelengths). The stacking of metasurfaces therefore adds additional degrees of freedom in the design of a flat lens (or alternative optical element).

Figure 3:
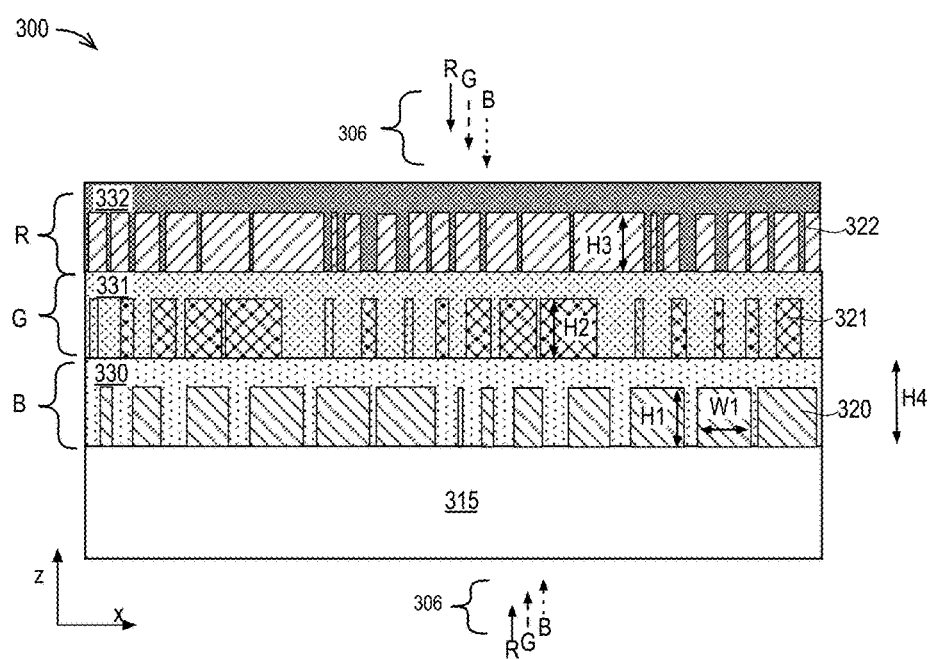
FIG. 3 is a cross-sectional view of a multi-level metasurface, in accordance with some embodiments.

FIG. 3 is a cross-sectional view of a multi-level metasurface structure 300, in accordance with some embodiments. Multi-level metasurface structure 300 may be suitable, for example for redirecting light 306, which may be incident to either a top side or bottom side of structure 300. In some exemplary embodiments, light 306 is chromatic and includes the visible band (e.g., having blue light of $\lambda \approx 450$-495 nm, green light of $\lambda \approx 495$-570 nm, and red light of $\lambda \approx 620$-750 nm). Hence, light 306 may have three (RGB) center wavelengths. Structure 300 may advantageously balance the chromatic aberrations (such as dispersion) over three levels of structure.

Substrate 300 includes one substrate 315. Substrate 315 may include any material(s) known to be suitable for the manufacture of a metasurface (e.g., quartz). In some embodiments, substrate 315 is amorphous silicon dioxide (e.g., glass). Substrate 315 may also be, or include, any other material that is also at least partially transmissive of the visible spectrum. Each of the levels in structure 300 includes a metasurface and a surrounding interface material. In the illustrated example, a first (e.g., blue) level includes metasurface 320 and an interface material 330. A second (e.g., green) level includes metasurface 321 and interface material 331. A third (e.g., red) level includes metasurface 322 and interface material 332. Each of metasurfaces 320-322 includes nanostructures spatially distributed over an area of substrate 315. The nanostructures in each of metasurfaces 320-322 are advantageously transmissive over light 306 (e.g., transmissive of the visible light band) with lower absorbance being advantageous for lower optical loss within structure 300.

In exemplary embodiments, at least one of nanostructure dimensions, aspect ratios, topology, or spatially arrangement varies between metasurfaces 320, 321 and 322. One or more of the attributes of metasurface 320 induce a phase shift of some non-zero threshold magnitude for a first wavelength within the visible light band. For example, metasurface 320 may induce a phase shift between 0 and $2\pi$. One or more of the attributes of metasurface 321 likewise induce a phase shift of between 0 and $2\pi$ (for another wavelength within the visible light band. In some advantageous embodiments, metasurface 321 induces a phase shift at least equal to the threshold magnitude induced by metasurface 320. One or more of the attributes of metasurface 322 likewise induce a phase shift of between 0 and $2\pi$ (for still another wavelength within the visible light band. In some advantageous embodiments, metasurface 322 induces a phase shift at least equal to the threshold magnitude induced by metasurfaces 320 and 321. In some embodiments, each of the wavelengths experiencing at least the threshold phase shift is separated from the others by at least 50 nm, and advantageously 75 nm, or more. For example, the center wavelengths of each of the R, G, and B sub-bands within the visible light band may experience phase shift of at least a threshold magnitude as a result of resonance with the nanostructures of a given metasurface level within structure 300.

As further shown in FIG. 3, metasurface 320 includes nanostructures having a lateral dimension (width or diameter) W1 parallel to a plane of substrate 115. The nanostructures (e.g. cylinders with diameter W1) have a vertical height H1, orthogonal to a plane of substrate 115. The lateral dimension W1 may vary from some predetermined minimum to some predetermined maximum. A pitch of the nanostructures may likewise vary from a predetermined minimum to a predetermined maximum. The height H1, although illustrated as being substantially constant, may alternatively also span a range of heights (e.g., between some predetermined minimum and maximum). Metasurface 321 includes nanostructures having a lateral dimension W2 and a height H2. The lateral dimension W2, and associated pitch may each likewise vary from some predetermined minimum to some predetermined maximum. The height H2, although illustrated as being substantially constant, may alternatively also span a range of heights (e.g., between some predetermined minimum and maximum). Metasurface 322 includes nanostructures having a lateral dimension W3 and a height H3. The lateral dimension W3, and associated pitch may likewise each vary from some predetermined minimum to some predetermined maximum. The height H3, although illustrated as being substantially constant, may alternatively also span a range of heights (e.g., between some predetermined minimum and maximum).

The range of lateral dimensions, range of pitches, and/or heights of nanostructures may be different for each of metasurfaces 320, 321 and 322 so as to tune structure resonance to a particular center wavelength. Resonant wavelengths will most strongly optically couple with a metasurface, while wavelengths outside of the resonant wavelength(s) will transmit through with minimal optical coupling. Hence, nanostructure dimensions and/or pitch may be predetermined for metasurface 320 to optically couple more strongly with blue light while the longer G and R wavelengths will not couple as strongly (and potentially not at all) with metasurface 320. Nanostructure dimensions and/or pitch may be predetermined for metasurface 321 to optically couple more strongly with green light while the shorter B and longer R wavelengths will not optically couple as strongly (and potentially not at all) with metasurface 321. Nanostructure dimensions and/or pitch may be predetermined for metasurface 322 to optically couple more strongly with red light while the shorter B and G wavelengths will not couple as strongly (and potentially not at all) with metasurface 322.

Notably, the ordering of metasurfaces 320, 321 and 322 with respect to substrate 115 may be inverted from the "R, G, B" stack illustrated to a "B, G, R" stack, or to any other layering permutation. The more precisely tuned a metasurface, the closer to diffraction limited the peak efficiency may become. Precise tuning may also result in the optical efficiency as function of wavelength becoming more peaked. With the multiple metasurface levels, each level may be more precisely tuned while a broadband response is still maintained. With mixing of nanostructure dimensions or topology across the multiple metasurface levels (i.e., inter-level mixing), mixing of nanostructure dimensions or topology within one level (i.e., intra-level mixing) is unnecessary to achieve a given bandwidth. Without such intra-level mixing, efficiency may be improved, for example better approximating the diffraction limit.

In some embodiments, the pitch of the nanostructure protrusions making up metasurfaces 320, 321 and 322 may span a range of 10 nm-1000 nm, and advantageously 10-600 nm, for example. Any one of the metasurfaces may have a pitch ranging from 200-500 nm, or 300-500 nm, for example. The heights of nanostructure of metasurfaces 320, 321 and 322 may likewise span a range of about 10 nm-1000 nm, and advantageously 10-500 nm, for example. Any one of the metasurfaces may have height that is anywhere between 50-500 nm, or 100-500 nm, for example. The dimensions and pitch may be based, for example, on the wavelength of light the metasurface is to couple. For example, the height may be about the wavelength of a target center wavelength of light divided by two (i.e., $H1 \approx \lambda_{center, blue}/2$). The lateral width W1 may vary, for example, from about the target center wavelength of light divided by seven (i.e., $W1 \approx \lambda_{center, blue}/7$), to about the target center wavelength of light divided by five (i.e., $W1 \approx \lambda_{center, blue}/5$). In some further embodiments, at least the minimum lateral dimension of nanostructures in metasurface 320 is different than the minimum lateral dimension of nanostructures in metasurface 321. In some further embodiments, the maximum lateral dimension of nanostructures in metasurface 320 is no greater than the minimum lateral dimension of nanostructures in metasurface 321. For such embodiments, there is no overlap in the range of lateral dimensions between metasurfaces 320 and 321. Similar relationships may exist between metasurfaces 321 and 322.

In some embodiments, the height of nanostructures in metasurface 320 is different than the height of nanostructures in metasurface 321. For embodiments where metasurface 320 is to couple strongly with a blue center wavelength, and metasurface 321 is to couple strongly with a green center wavelength, metasurface 320 includes nanostructures having a height smaller than those of metasurface 321. A similar relationship may exist between metasurfaces 321 and 322 where metasurface 322 is to couple strongly with a red center wavelength. In some specific examples, for the red center wavelength, height H3 is at least 420 nm, and lateral dimension W3 is between 90 nm and 160 nm. In some further examples, for a green center wavelength, the height H2 is at least 350 nm, and the lateral dimension W2 is between 75 nm and 90 nm. In some further examples, for a blue center wavelength the height H1 is at least 310 nm, and the lateral dimension W2 is between 45 nm and 75 nm.

Figure 4:
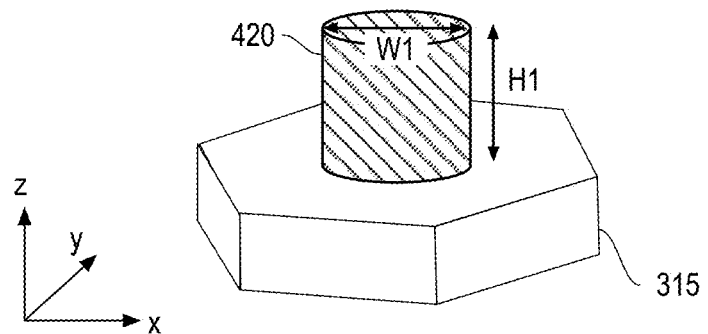
FIG. 4 is an isometric view of a nanostructure that may be included within a metasurface, in accordance with some embodiments.

Metasurface structures described herein may have any topology, and have any composition suitable for a given optical element and a given target wavelength of light. In some embodiments, a metasurface (e.g., each of the metasurfaces 320, 321 and 322 in FIG. 3) includes a plurality of nanostructures that have a substantially homogenous (i.e., bulk) composition. FIG. 4 is an isometric view of a bulk nanostructure 420 on substrate 315. Nanostructure 420 may be one of many such nanostructures included within a metasurface, such as metasurface 320 (FIG. 3), for example. Nanostructure (or "nanoantenna") 420 is cylinder of elliptical or circular cross-section along a plane parallel to a plane of substrate 315. Nanostructure 420 has predetermined lateral dimension and/or azimuthal orientation with respect to the plane of the substrate 315. Regardless of the dimension and orientation, nanostructure 420 is a homogenous material. A metasurface may confine and manipulate incident light as a function of refractive index contrast between nanostructure 420 and background environment (e.g., any surrounding interface material). The composition of nanostructure 420 may be selected to have an advantageously high refractive index.

Nanostructure 420 is also advantageously transmissive of the incident light, which further constrains nanostructure composition as a function of the incident light band. For example, nanostructure 420 might be silicon (amorphous or crystalline), which has an exceptionally high refractive index (exceeding 3.5 for many wavelengths, as shown in Table 1).

TABLE 1

Refractive index for various materials

| Wavelength (color) | a-Si | c-Si | $TiO_2$ | $Hf_2O_3$ | $Si_3N_4$ | $Al_2O_3$ | $SiO_2$ |
|---|---|---|---|---|---|---|---|
| 460 nm (Blue) | 4.95 | 4.68 | 2.6 | 2.11 | 2.06 | 1.78 | 1.53 |
| 550 nm (Green) | 4.46 | 4.07 | 2.48 | 2.07 | 2.03 | 1.77 | 1.52 |
| 650 nm (Red) | 4.07 | 3.85 | 2.42 | 2.05 | 2.02 | 1.77 | 1.51 |

However, for exemplary embodiments where the incident light includes the visible band, many high index materials, such as silicon and germanium, can absorb a large percentage of the light with a large optical loss suffered because of the metasurface material's small band gap 1.12 eV) of the metasurface material composition. Table 2 lists refractive index, required thickness at maximum scattering efficiency ($\eta_{max}$), $\eta_{max}$, and visible light loss for some illustrative material compositions. The maximum scattering efficiency in Table 2 was calculated by using periodic transmissive metasurfaces (i.e., metagratings) as a model system that deflects a normally-incident plane wave to a particular diffraction order. As shown in Table 2, silicon can absorb 40%, or more, of RGB wavelengths.

TABLE 2

|  | $SiO_2$ | $Al_2O_3$ | $Si_3N_4$ | $TiO_2$ | Si | Ge |
|---|---|---|---|---|---|---|
| Refractive Index | 1.5 | 1.8 | 2 | 2.5 | 3.5 | 4 |
| Thickness at Max Efficiency (nm) | 1800 | 1600 | 1500 | 1000 | 500 | 300 |
| Maximum Scattering Efficiency (%) | 20 | 40 | 50 | 80 | 95 | 95 |
| Light Absorbance in Visible Range | 0 | 0 | 0 | 0 | >40% | >90% |

In some exemplary embodiments more suitable for the visible light band, nanostructure 420 is a compound comprising at least titanium and oxygen (e.g., $TiO_2$), a compound comprising at least silicon and nitrogen ($Si_3N_4$), or a compound comprising at least hafnium and oxygen (e.g., $Hf_2O_3$). Other compounds not listed in the tables above are also possible. For example, a compound comprising at least gallium and phosphorus (e.g., binary GaP), crystalline diamond, or diamond-like carbon (DLC) may be suitable for nanostructures. Of materials substantially transparent to visible light wavelengths, those with the highest refractive index, such as $TiO_2$ with a refractive index of 2.4-2.6, may be most effective in manipulating optical wave-fronts. Other materials with lower refractive indices, such as silicon nitride ($Si_3N_4$) with a refractive index of about 2.0, may only marginally support an optical resonance sufficient for manipulating optical wave-fronts.

Due to the lower refractive index, even when nanostructure 420 is a homogenous $TiO_2$ "meta atom," nanostructure 420 may need to have a very high aspect ratio of 5-10. The high aspect ratio complicates manufacturing of a metasurface. For example, the deposition of thick $TiO_2$ layers (e.g., ~600 nm, or more) can be very expensive because of low deposition rates (e.g., ALD processes may deposit $TiO_2$ at rate around 0.05 nm/s).

Figure 5:
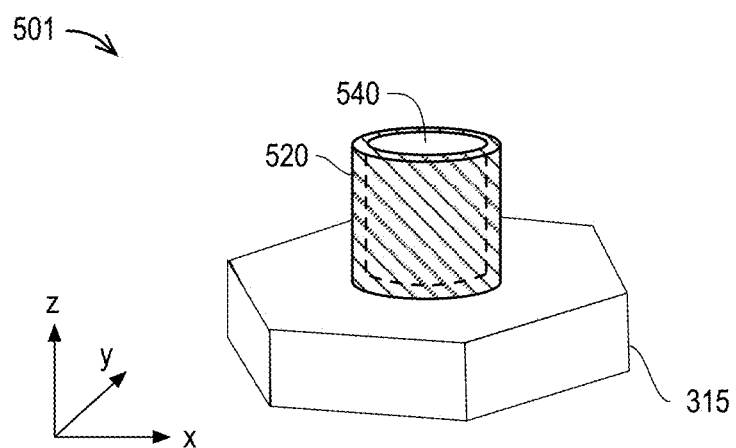
FIG. 5 is an isometric view of a nanostructure that may be included within a metasurface, in accordance with some alternative embodiments.
Figure 6:
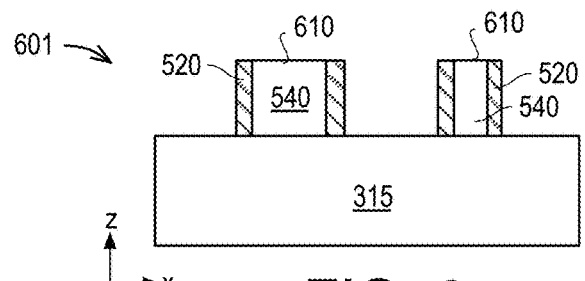
FIGS. 6, 7, 8 and 9 are cross-sectional views of nanostructures that may be included within a metasurface, in accordance with some alternative embodiments.
Figure 7:
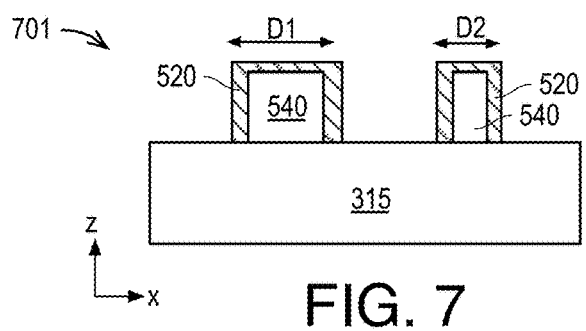

In accordance with some alternative embodiments, a metasurface includes a plurality of nanostructures and each of the nanostructures further includes both a core material, and a cladding material. FIG. 5 is an isometric view of a nanostructure 501, in accordance with some such embodiments. As shown, nanostructure 501 includes a cladding material 520 over a sidewall of a core material 540. In this example, core material 540 has a cylindrical shape that may be similar to nanostructure 420, for example. Core material 540 advantageously has a relatively low optical absorption, and may also have a relatively low refractive index. Core material 540 may comprise silicon and nitrogen (e.g., $Si_3N_4$), as one example. Cladding material 520 advantageously has a relative high refractive index, and may also have a relatively high optical absorption, the effect of which is mitigated by cladding material 250 having a thickness (e.g., as measured from a sidewall of core material 540) that is far less than nanostructure height H1. For example, cladding material 520 may be $TiO_2$, silicon, or any of the other materials described elsewhere herein in the context of homogeneous meta atom structures. Cladding material 520 may have a film thickness less than 100 nm (e.g., 5-50 nm). Nanostructure 501 is therefore a heterogeneous meta atom structure that combines high light confinement and low optical absorption within the visible range, while also enabling the higher manufacturing throughput needed for low-cost flat optical elements that include one or more metasurface.

Heterogeneous meta atom structures including both a core material and cladding material may be implemented in a variety of manners. FIGS. 6, 7, 8 and 9 are cross-sectional views of metasurfaces that include a plurality of heterogeneous meta atoms, in accordance with some embodiments. In the example shown in FIG. 6, metasurface 601 includes a plurality of nanostructures 501, substantially as introduced above. As shown, cladding material 520 is only on a sidewall of core material 540. Cladding material 520 completely surrounds the sidewall of core material 540. Core material 540 therefore has an unclad top surface 610 that is exposed to some surrounding interface material (e.g., air, a dielectric, etc.). Notably, core material 540 is in direct contact with substrate 315 with there being no cladding material 520 between core material 540 and substrate 315. In the example shown in FIG. 7, metasurface 701 includes a plurality of nanostructures with a cladding material 520 that is both surrounding a sidewall of core material 540 and over the top surface of core material 540 such that the only unclad surface of core material 540 is between core material 540 and substrate 315. In some further embodiments, cladding material 520 may be continuous over multiple cores. For example cladding material 520 may cover all portions of substrate 315 between adjacent nanostructures (meta atom structures). As further shown in FIG. 7, the thickness of cladding material 520 may be substantially constant for nanostructures of different dimensions (e.g., D1 and D2).

Figure 8:
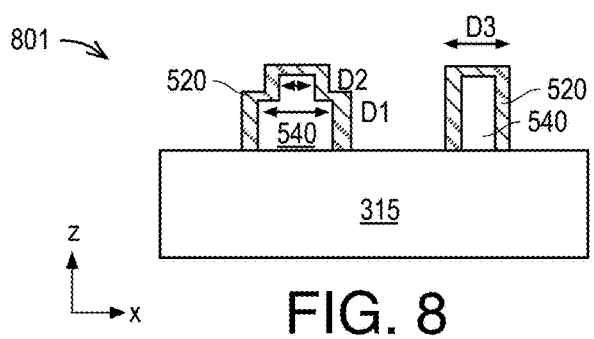
Figure 9:
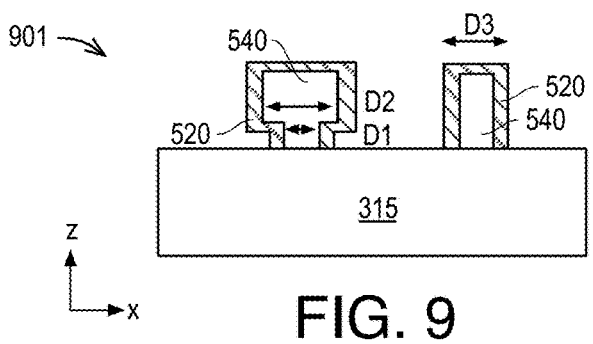

Heterogeneous meta atom structures may also have any suitable topology, with the above cylindrical examples merely being illustrative. In some embodiments, for example, a core material may be patterned to have a lateral width that varies over the height of the nanostructure. In FIG. 8, metasurface 801 includes heterogeneous meta atom structures, at least some of which have a larger core diameter D1 at their base proximal to substrate 315 and a smaller core diameter D2 at their top. In FIG. 9, metasurface 901 includes heterogeneous meta atom structures, at least some of which have a smaller core diameter D1 at their base proximal to substrate 315 and a larger core diameter D2 at their top. For these embodiments as well, the core topology is modulated while the cladding remains a conformal film of a predetermined thickness.

Figure 10A:
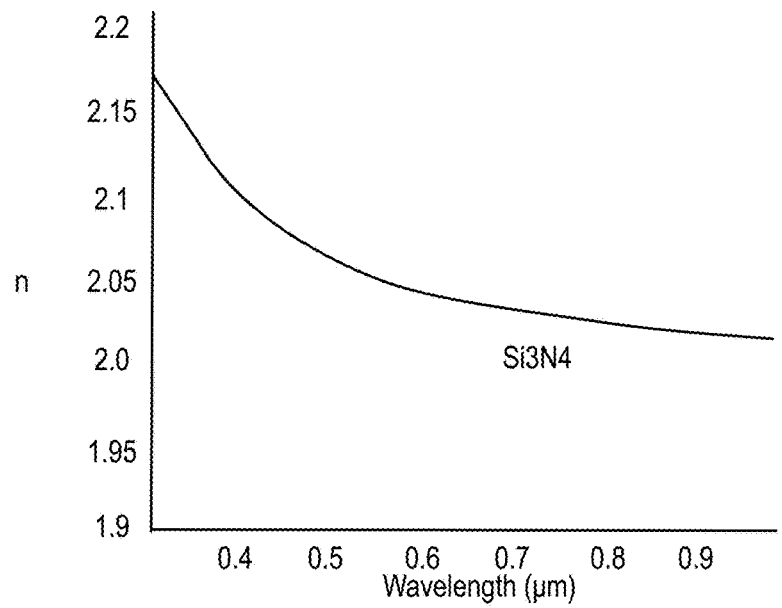
FIGS. 10A and 10B are graphs illustrating refractive index of two materials as a function of wavelength, in accordance with some embodiments.
Figure 10B:
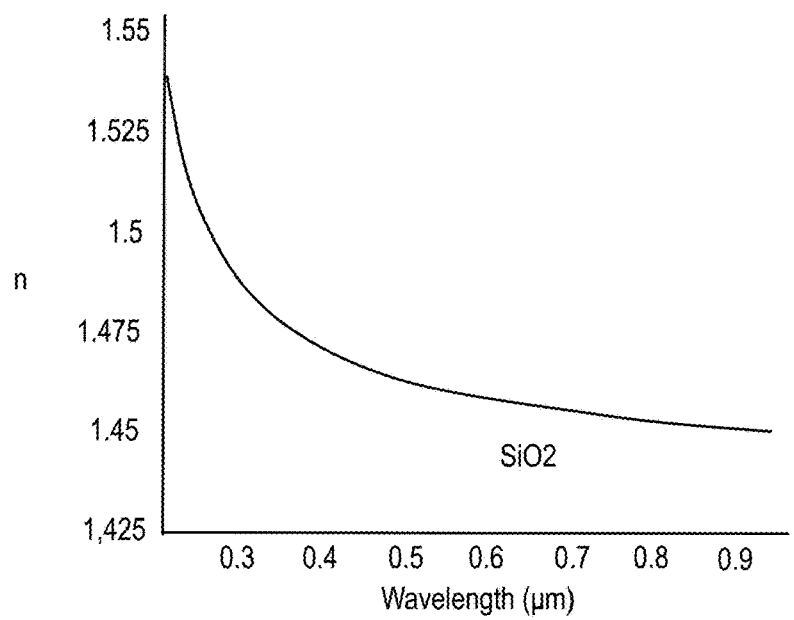

As introduced above, each level of a multi-level metasurface structure may further include an interface material (e.g., interface material 330 in FIG. 3). The interface materials employed within a multi-level metasurface structure may be selected to improve index contrast at each level. Hence, in addition to independently tuning metasurface dimensions and topologies of each level of a multi-level metasurface, index contrast may also be independently tuned for each of the metasurface levels. In some exemplary embodiments, the interface material employed in a multi-level metasurface structure is a low index dielectric material (e.g., <1.45 within the visible light band). For embodiments where different metasurface levels of a multi-level structure are tuned to different center wavelengths, the interface material within each metasurface level may be selected based on index contrast at the target center wavelength. In some embodiments where the index of refraction of a metasurface varies as a function of wavelength (e.g., index declines with increasing wavelength as shown in FIG. 10A for silicon nitride), the index contrast (Δ) achieved at one level tuned to a first (e.g., short) wavelength can be maintained at another level that is tuned to a second (e.g., longer) wavelength if the interface material has an index of refraction that varies similarly (e.g., declines at a similar rate with increasing wavelength).

Where the change in index contrast between two materials varies significantly as a function of wavelength, different interface materials may be employed. For example, as shown in FIG. 10B, silicon dioxide has an index of refraction that declines somewhat less than silicon nitride as a function of wavelength within the visible band. Index contrast between the two materials therefore declines with wavelength. Where index contrast across a band varies significantly more for one or the other of the metasurface or the interface material, different interface materials may be employed within different levels of a multi-level metasurface structure to reduce variation in the index contrast as a function of wavelength. For example, in further reference to FIG. 3, for embodiments where metasurfaces 320, 321 and 322 all have the same composition (e.g., TiO$_2$) interface materials 330, 331 and 332 may have different compositions to reduce variation in the index contrast as a function of wavelength. Interface material 330 may therefore have a first index contrast with metasurface 320 at a center wavelength for which metasurface 320 is tuned (e.g., B), and have a second index contrast with metasurface 320 at a center wavelength for which metasurface 321 is tuned (e.g. G). Interface material 331 has a third index contrast with metasurface 321 at the center wavelength for which metasurface 321 is tuned (e.g., R). The difference between the first and third contrasts is advantageously less than the difference between the second and third contrasts. Alternatively, where index contrast variation as a function of target center wavelength is insignificant for a given optical element design, interface materials 330, 331 and 332 may all have the same composition.

With many features of multi-level metasurface structures described above, discussion now turns to the manufacture of metasurface structures. As noted above, the manufacture of metasurfaces is challenging given the nanometer (e.g., 10-1000 nm) dimensions of the structures and their characteristic surface features, which are generally to be below the wavelength of the incident light. Lithography and etch processes are typically used to fabricate metasurface materials directly. However, such processes, and the equipment used for these processes, are costly, especially when performed over a large optical element surface area (e.g. 1-30 mm, or more).

Figure 11:
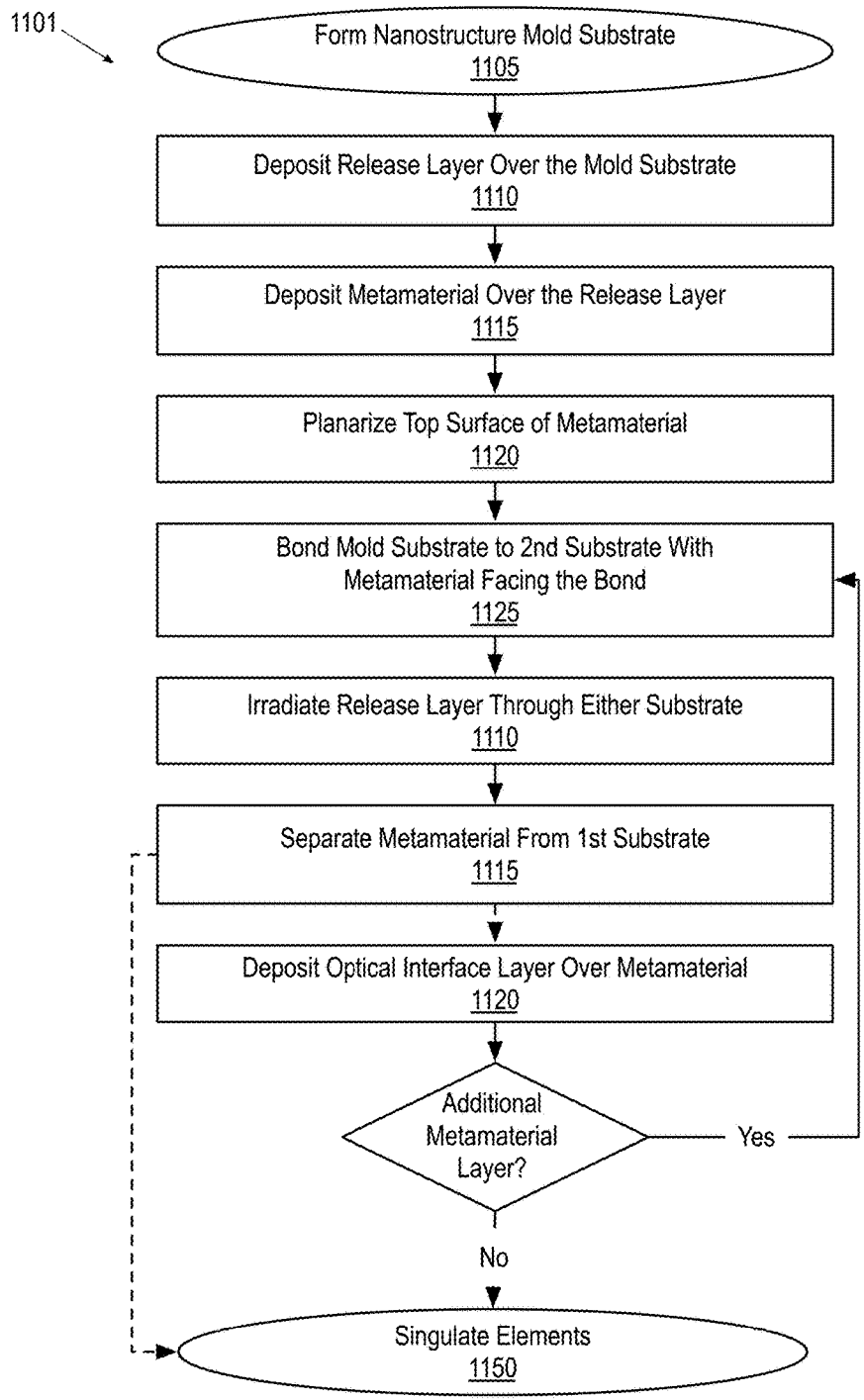
FIG. 11 is a flow diagram illustrating methods of fabricating a multi-level metasurface, in accordance with some embodiments.

FIG. 11 is a flow diagram illustrating methods 1101 for fabricating a multi-level metasurface, in accordance with some embodiments. Although fabrication is described in the context of exemplary multi-level metasurface structures, such as one or more of the structures described above, the techniques described are broadly applicable to the manufacture of any metasurface. Hence, although certain techniques are enlisted in a manner that can be employed to fabricate a multi-level metasurface, the same techniques may be enlisted to fabricate a simpler structure having a single metasurface. FIGS. 12A, 12B, 12C, 12D, 12E, 12F, 12G, 12H and 12I are cross-sectional views of a multi-level metasurface evolving as selected operations of the methods illustrated in FIG. 11 are performed, in accordance with some embodiments.

In further reference to FIG. 11, methods 1101 begin at operation 1105 where a nanostructure mold is formed in first substrate. The nanostructure mold is to be a negative of a desired metasurface. Hence, a predetermined arrangement of nanostructures suitable as a first metasurface is parameterized and manipulated so as to flip the polarity of the metasurface, converting dimensioned protrusions of a metasurface into depressions of a same dimension in the mold substrate. Any technique known in the art to be suitable for patterning a metasurface with the dimensions described above may be employed to pattern a surface of opposite polarity in the mold substrate. For example, in some embodiments a mask pattern is lithographically (e.g., DUV) patterned, and that mask pattern then translated into the mold substrate through an etching (e.g., anisotropic) process. The costs associated with such lithographic processing, including the cost of a substrate that has flatness suitable for such patterning techniques can be high. However, in accordance with some exemplary embodiments, the metasurface patterning cost is reduced through use of a large format substrate exceeding the dimension of the typical optical element that will employ the metasurface, and by patterning a mold that is further employed in the manufacture of a metasurface rather than directly patterning the metasurface. The cost of the mold is therefore reduced with every additional use of the mold, and the cost of a given metasurface is then tied to a molding process that includes only some fraction of the mold cost.

Figure 12A:
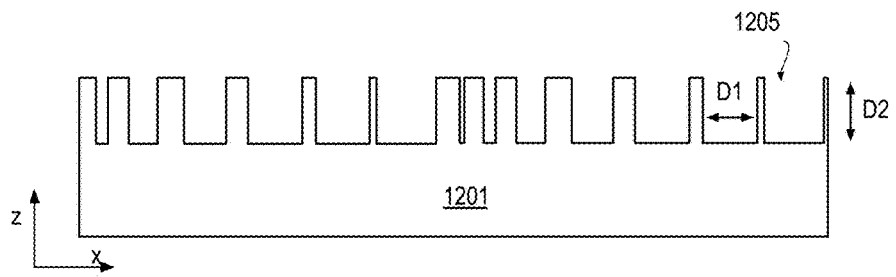
FIGS. 12A, 12B, 12C, 12D, 12E, 12F, 12G, 12H and 12I are cross-sectional views of a multi-level metasurface evolving as selected operations of the methods illustrated in FIG. 11 are performed, in accordance with some embodiments.

In the example further illustrated in FIG. 12A, a mold substrate 1201 includes recesses, vias, or trenches 1205. Mold substrate 1201 may include any material known to be suitable for integrated circuit (IC), optical IC (OIC), and/or micro-electro-mechanical system (MEMs) fabrication. In some exemplary embodiments, mold substrate 1205 includes a crystalline semiconductor substrate, such as but not limited to, a (mono) crystalline silicon wafer. Only a portion of mold substrate 1201 is illustrated in FIG. 12A and mold substrate 1205 may have any diameter, including large format (200 mm-450 mm diameter) wafers. As such, mold substrate 1205 may include a plurality of metasurface molds, which may all be substantially identical. For example, a single mold may occupy a footprint of 1-5 mm$^2$ and a number of such molds may be patterned to have a give pattern of trenches 1205. Mold substrate 1201 may include any number of material layers. For example, where mold substrate 1201 includes monocrystalline silicon, mold substrate 1201 may further include one or more material layers over the silicon. In some such embodiments, mold trenches 1205 are patterned into a layer of silicon dioxide that is over a silicon layer of substrate 1201. The thickness of the silicon dioxide layer may exceed a depth of mold trenches 1205 such that only the silicon dioxide portion of substrate 1201 is depicted in FIG. 12A. One or more stop layers (not depicted), such as an alternative dielectric material, may also be embedded with substrate 1201. Following any suitable etch masking process, for example including a photosensitive mask and DUV lithography, any etch process suitable for the substrate material may be utilized to form mold trenches 1205 into substrate 1201. For example, a silicon dioxide substrate layer may be patterned with an anisotropic dry etch.

As shown in FIG. 12A, mold trenches 1205 may be patterned to have lateral diameters that vary within a footprint of one optical element, and therefore periodically vary over a diameter of substrate 1201. Trenches 1205 have a lateral (e.g., x-axis) dimension D1 sufficiently larger than is desired for predetermined nanostructure (e.g., W1 of FIG. 3) so as to accommodate a thickness of a subsequently deposited mold release layer within trenches 1205. For example, mold trenches 1205 may have a lateral dimension D1 5-100 nm wider than predetermined nanostructure dimension. Mold trenches 1205 may likewise have a depth D2 greater than a predetermined target height (e.g., H1 of FIG. 3) desired for a nanostructure, again to accommodate the subsequently deposited mold release layer. For example, mold trenches 1205 may have a depth D2 that is 5-100 nm deeper than a predetermined target height of nanostructures. In the example illustrated all mold trenches 1205 have substantially the same depth (e.g., within 10% of target). Notably however, depth D2 of trenches 1205 may also vary within a footprint of one optical element. Different depths D2 may be achieved, for example, through etch rate variation that is dependent on the lateral diameter of mold trenches 1205, or through a multiple patterning process.

Returning to FIG. 11 with the mold substrate now patterned, methods 1101 continue at operation 1110 where a release layer is deposited over the mold substrate. The release layer is advantageously deposited with a highly conformal process to ensure a uniform (e.g., with 10% of target) release layer thickness. The release layer may be deposited to any thickness, but is advantageously deposited to a thickness that is less than half the minimum lateral diameter of the mold trenches 1205 to ensure none of the desired mold trenches 1205 are occluded by the release layer. In some exemplary embodiments, the release layer is deposited to a thickness less than 50 nm, advantageously less than 25 nm, more advantageously less than 10 nm, and may even be deposited to 5 nm, or less. The deposition technique may vary with composition of the release layer, with exemplary techniques including chemical vapor deposition (CVD), with atomic layer deposition (ALD) being particularly well-suited to depositing nanometer thick films conformally on high aspect ratio features of the mold.

Figure 12B:
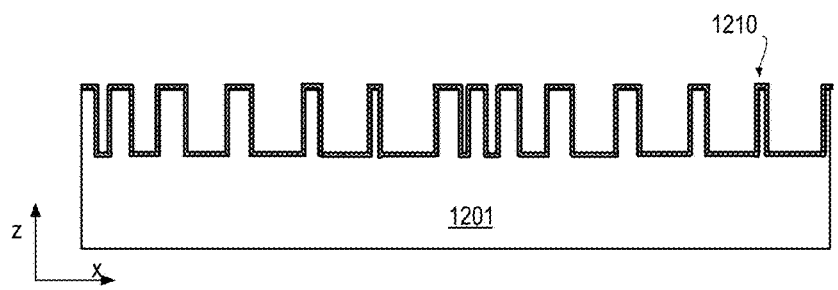

In the example illustrated in FIG. 12B, release layer 1210 has been deposited over the mold substrate 1201, covering a sidewall of mold trenches 1205 and a top surface of mold substrate 1201 between adjacent mold trenches 1205. Release layer 1210 is advantageously a continuous film and may include one or more material layers. In some exemplary embodiments, release layer 1210 comprises silicon. In some advantageous embodiments, release layer 1210 is predominantly silicon. For example, release layer 1210 may be substantially silicon (e.g., amorphous or polycrystalline) with some level of impurities indicative of the deposition technique (e.g., including hydrogen, etc.). In some such embodiments, release layer 1210 has a thickness of 10 nm, or less (e.g., 5 nm).

Returning to FIG. 11 with the release layer over the mold substrate, the mold trenches now have the lateral dimensions and depth(s) desired for a given metasurface. Methods 1101 continue at operation 1115 where a metamaterial of any suitable composition is deposited over the release layer. Any deposition technique suitable for the metamaterial may be employed at operation 1115. For example, CVD, plasma-enhanced CVD (PECVD), ALD, or even spin-on techniques may be employed. Operation 1115 may entail one or more such deposition techniques. For example, where a metasurface is to comprise a cladding of a first material over a core of another material, operation 1115 may entail first lining the mold trenches conformally with the cladding material, followed by a backfill of the mold trenches with the core material. Alternatively, where a metasurface is to comprise nanostructures having a single bulk composition, operation 1115 may entail a singled deposition process that backfills, superfills, or overfills the mold trenches. Operation 1115 may also include one or more thermal cure or anneal process following material deposition.

Figure 12C:
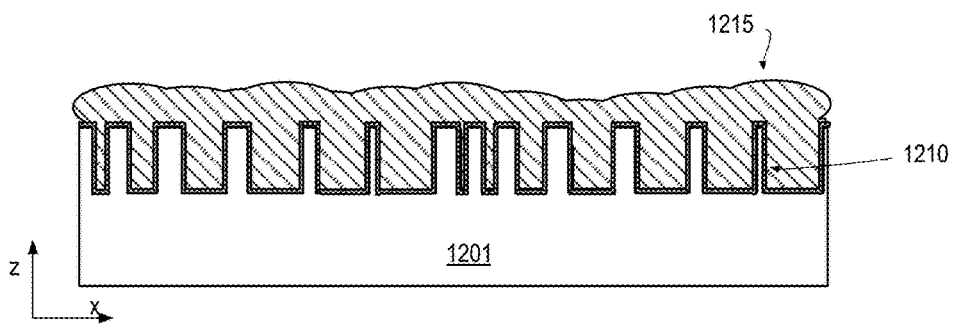
Figure 12D:
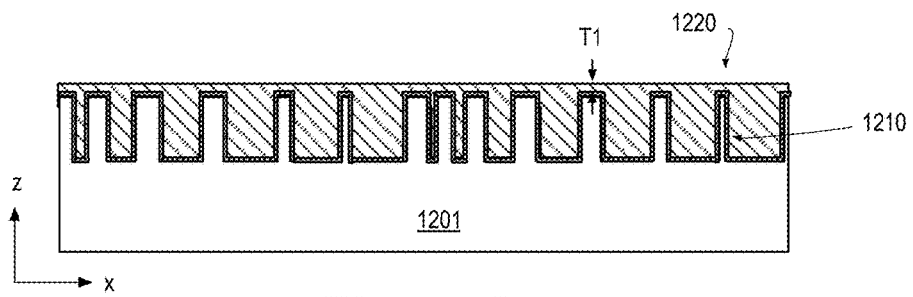

In the example further illustrated in FIG. 12C, a metamaterial 1215 has been deposited over release layer 1210 and over the mold substrate 1201 to completely fill trenches 1205. In this example metamaterial 1215 has a homogeneous composition, such as $TiO_2$, or any of the other materials described elsewhere herein as suitable for the application. $TiO_2$ embodiments may be deposited with PECVD, for example to achieve a highest deposition rate and/or lowest cost, although other techniques, such as ALD, may also be practiced.

Returning to FIG. 11 with the metasurface mold now loaded, methods 1101 continue at operation 1120 where any overburden associated with the metamaterial deposition process(es) is removed. Operation 1120 may entail any suitable planarization process, such as, but not limited to, chemical mechanical planarization (CMP), polishing, or lapping. The planarization process will reduce a total thickness of the metamaterial as it is planarized over the diameter of the substrate. Upon completion of operation 1120, the thickness of the metamaterial over regions of the mold between trenches may vary from tens of nanometers to none where the release layer and/or mold substrate material is fully exposed between the substrate trenches. In the example further illustrated in FIG. 12D planarized metamaterial surface 1220 has a minimum thickness T1 between the filled mold trenches. T1 may however be reduced to zero with release layer 1210 or substrate 1201 then exposed between the filled trenches 1205. Hence, although planarized metamaterial surface 1220 is illustrated as a continuous surface, to arrive at the metasurface 320 (FIG. 3), planarization should continue to breakthrough the metamaterial in regions between the mold trenches.

Returning to FIG. 11 with the metasurface now ready for transfer, methods 1101 continue at operation 1125 where the mold substrate is bonded to an optical element substrate. The metamaterial is proximal to the bond, with the planarized surface of the metamaterial at the bond interface. The optical element substrate input to operation 1125 may include any starting material having suitable optical properties (e.g., transmissive over a predetermined light band). For example, the optical element substrate may be glass, or quartz, or a crystalline semiconductor, etc. Notably, the optical element substrate should have approximately the same diameter as the mold substrate (e.g., 200-450 mm) and therefore the optical element substrate may have an area that encompasses multiple optical elements. In some exemplary embodiments, where multiple metasurface levels are being fabricated, the optical element substrate input to operation 1125 may further include another metasurface, for example, as generated through a prior iteration of methods 1101. In some advantageous embodiments, the optical element substrate input to operation 1125 includes a bond layer to which the metamaterial surface is bonded. The bond layer may have any composition suitable for bonding to the surface of a metamaterial, and any wafer-to-wafer bonding technology may be employed at operation 1125 to bond the metamaterial surface to the bond layer of the optical element substrate. In some embodiments, the bond layer has the same composition as the metamaterial surface to which it is bonded. For example, where the metamaterial bonding surface is $TiO_2$, the bond layer may include a thin (e.g., 5 nm) layer of $TiO_2$. In another embodiment where the metamaterial includes another material, such as silicon nitride, the bond layer may include a thin (e.g., 5 nm) layer of silicon nitride or silicon dioxide. Where the metamaterial includes a cladding of $TiO_2$ over a core material, the bond layer may be the core material, or the cladding material.

Following the bonding operation, methods 1101 continue at operation 1130 with irradiation of the release layer to induce separation of the metamaterial and the mold. Such irradiation may induce degradation of bonds within the release layer and/or between the release layer and one or more of the bonding substrate and metamaterial. Irradiation may introduce energy of predetermined quantity to the release layer through one or more of the mold substrate and the optical element substrate. Irradiation may introduce energy sufficient to ablate the release layer. The irradiation energy advantageously has good coupling to the release layer while other layers of the bond assembly have low coupling efficiency. For example, where the release layer is silicon, UV irradiation may be employed to preferentially ablate the silicon release layer. Irradiation energy levels (doses) and wavelengths may be selected on the basis of the substrate composition, metamaterial composition, and release layer composition. The mold substrate may then be separated from the metamaterial, leaving the free surface of the metamaterial with an inverse pattern of the mold.

Figure 12E:
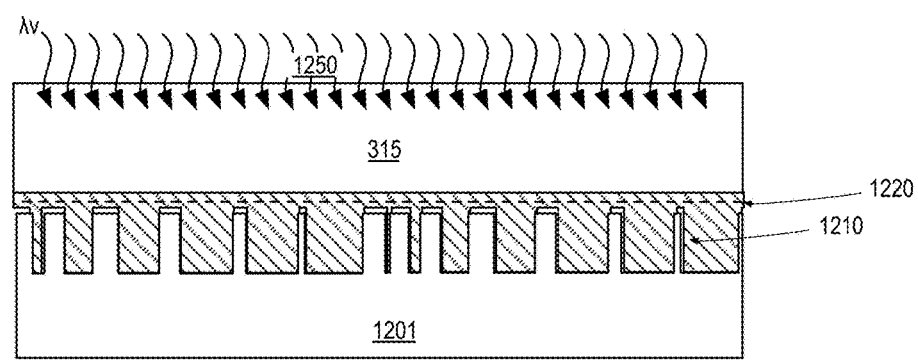
Figure 12F:
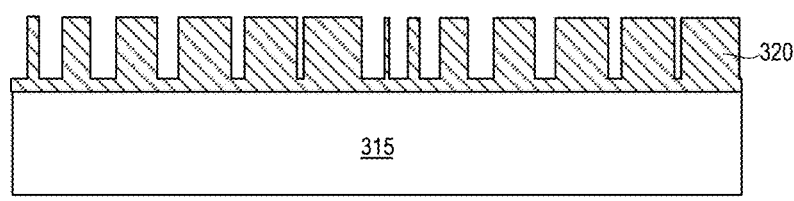
Figure 12G:
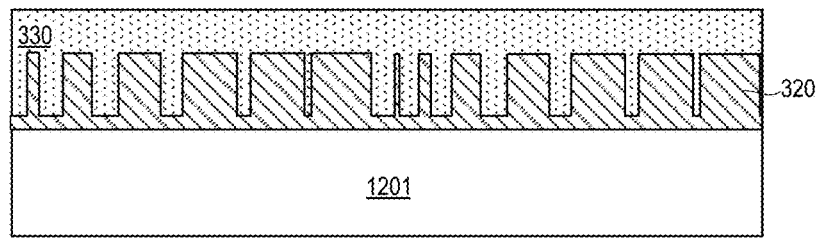
Figure 12H:
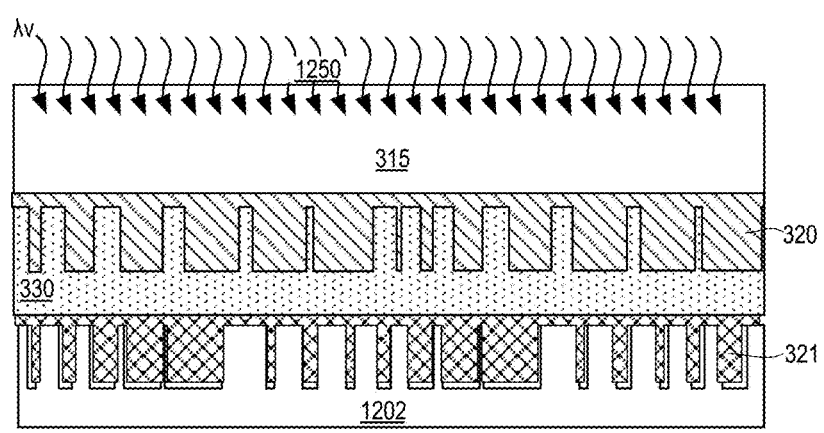

In the exemplary embodiment further illustrated in FIG. 12E, optical element substrate 315 has been bonded to metamaterial surface 1220. The bond interface is represented as a dashed line in FIG. 12E, with metamaterial (e.g., $TiO_2$) on both sides of the bond interface. As further illustrated in FIG. 12E, UV irradiation 1250 is applied through optical element substrate 315 (e.g., amorphous glass), ablating release layer 1210. Mold substrate 1201 is then separated from the metamaterial to arrive at the metasurface 320 on optical element substrate 315, as illustrated in FIG. 12F. At this point mold substrate 1201 is advantageously reused in subsequent processing of additional optical elements.

If a single level metasurface is the desired output of methods 1101, methods 1101 may proceed from operation 1115 to operation 1150 where the optical element substrate is singulated into individual optical elements. Alternatively, if a multi-level metasurface structure is desired, methods 1101 may iterate through one or more additional wafer bonding and separation sequences to build up a stack that includes multiple metasurfaces on a single optical element substrate. To facilitate further bonding, methods 1101 continue at operation 1120 where an optical interface layer is deposited over the free surface of the metamaterial generated at operation 1115. The optical interface layer is to provide a desired index contrast with the metasurface, and may be, for example, any of the materials described elsewhere herein. Operation 1115 may entail any deposition process suitable for the interface material, such as, but not limited to CVD, ALD, PECVD, and spin-on techniques. Depending on the interface material, the deposition process may be self-planarizing (e.g., flowable oxides) or a planarization process (e.g., CMP) may be employed after deposition of the interface material. In the example further illustrated in FIG. 12G, interface material 330 has been deposited over metasurface 320 with these materials being any of those described elsewhere herein, for example.

Figure 12I:
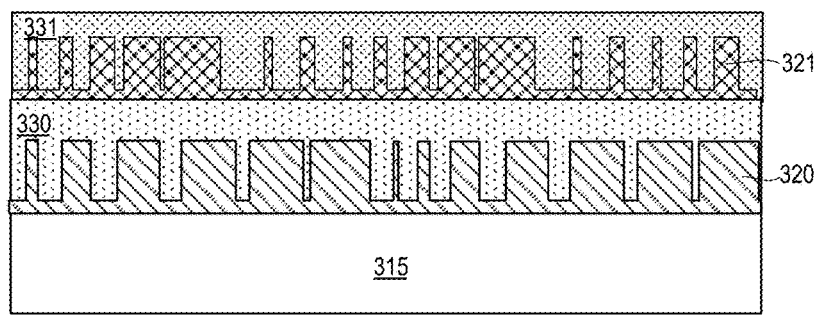

Methods 1101 may then continue to operation 1125 for another iteration if an addition metasurface level is desired. The output from operation 1120 may then be employed as the optical element substrate input into operation 1125 that is further bonded with another metamaterial-filled mold substrate that has been separately prepared. This additional metamaterial-filled mold substrate may have been prepared, for example, by performing operations 1105-1120 using one or more of a mold with trenches of different dimensions or a metamaterial of different composition. Operations 1125-1115 are then repeated to complete the further iteration of methods 1101 to arrive at an optical element with a multi-level metasurface structure. In the example further illustrated in FIG. 12H metasurface 321 has been filled into a second mold substrate 1202 and another irradiation 1250 is performed to ablate a second release layer, freeing metasurface 321 from mold substrate 1202. Following deposition of interface material 331, the multi-level metasurface structure illustrated in FIG. 12I is either ready for singulation, or another iteration of bonding to add another metasurface level (e.g., to arrive at the tri-level metasurface structure shown in FIG. 3). The fabrication methods 1101 (FIG. 11) may therefore be employed to make optical elements with any number of metasurface levels.

Figure 13:
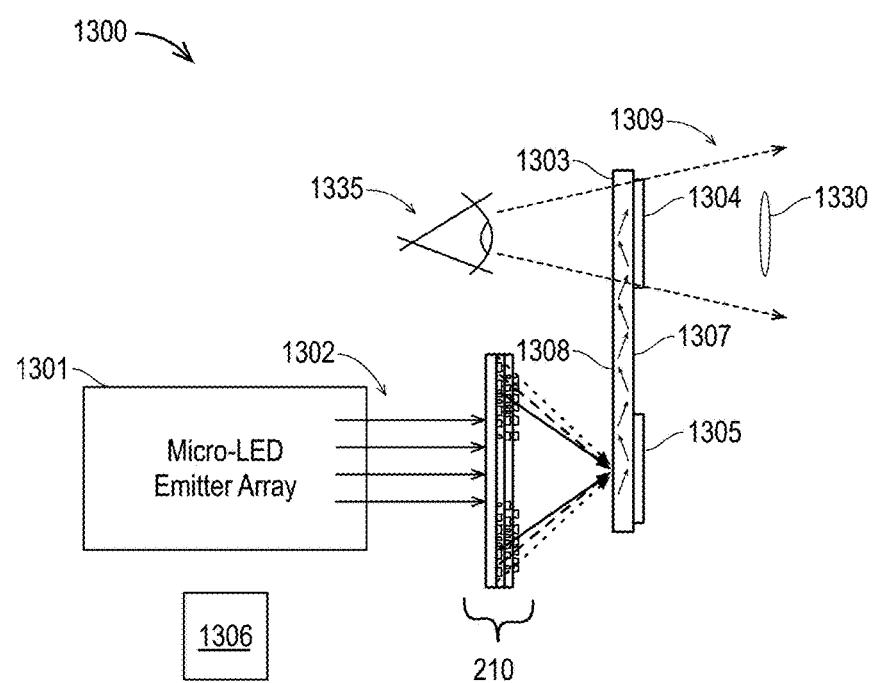
FIG. 13 is a schematic of an augmented reality display employing wideband flat lens, in accordance with some embodiments.

In some embodiments, an augmented reality device includes a light source, a display, a flat optical coupling element including a multi-level metasurface between the source and display, and a computer processor configured to provide image data for display. FIG. 13 is a schematic of an AR display device 1300 employing one or more μLED source 1301, in accordance with some embodiments. AR display device 1300 may be implemented in any suitable form factor, but not limited to, a headset, smart eyeglasses, or monocle. In some exemplary embodiments, LED source 1301 includes a blue LED source ($\lambda \approx 450$-495 nm), a green LED source ($\lambda \approx 495$-570 nm), and a red LED source ($\lambda \approx 620$-750 nm). Individual LEDs within the LED source may be separately driven by signals responsive to image data processed by processor 1306, for example. Coupling optics may comprise one or more flat lens, for example including a multi-level metasurface structure 210 having one or more of the features described elsewhere herein. Coupling optics may further comprise dichroic filters (e.g., for beam steering and/or conditioning, a condenser lens (stack) 410, and an optical integrator to improve spatial color distribution uniformity, any of which may include a multi-level metasurface structure having any of the features described elsewhere herein. The optical path is completed with a total internal reflection (TIR) optical waveguide 1303, and holographic beam splitters 1304, 1305 disposed on opposite ends of waveguide 1303. An image may enter the end of waveguide 1303 having holographic beam splitter 1304 via side 1308 of waveguide 1303 and a projected virtual image 1330 may be transmitted by waveguide 1303 (e.g., via internal reflection)

to holographic beam splitter 1304 such that virtual image 1330 is imaged within a viewport 1309. Computer processor 1306 may generate image data for display to user eye 1335 using any technique known in the art.

Figure 14:
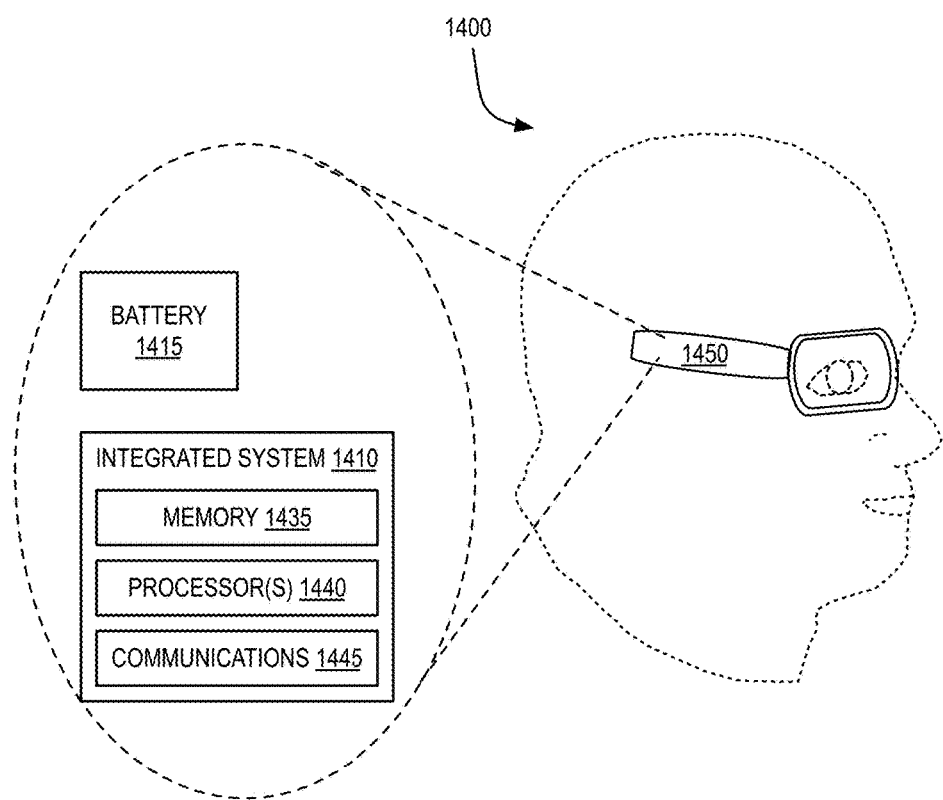
FIG. 14 illustrates an AR platform employing wideband flat lens, in accordance with some embodiments.

FIG. 14 illustrates a system 1400 in which an AR platform 1450 employs an emissive display device structure, arranged in accordance with at least some implementations of the present disclosure. AR platform 1450 may include a flat lens with a multi-level metasurface, for example as described elsewhere herein. AR platform 1450 may be any portable device configured for each of electronic data display, electronic data processing, wireless electronic data transmission, or the like. For example, although illustrated as a monocle, AR platform 1450 may have any headset form factor. While AR computing platform 1450 is an illustrative example, the optical elements with a multi-leveled metasurface discussed herein may also be employed in other platforms such as, but not limited to, desktop computer, television, mobile phone, virtual reality device, or other wearable device of similar functionality.

AR platform 1450 includes a chip-level or package-level integrated system 1410 and a battery 1415. Integrated system 1410 may be implemented as discrete components (e.g., integrated circuits) or as a system on a chip and may include may include memory circuitry 1435 (e.g., random access memory, storage, etc.), processor circuitry 1440 (e.g., a microprocessor, a multi-core microprocessor, graphics processor, etc.), and communications circuitry 1445 (e.g., a wireless transceiver, a radio frequency integrated circuit, a wideband RF transmitter and/or receiver, etc.). The components of integrated system 1410 may be communicatively coupled to one another for the transfer of data within integrated system 1410. Functionally, memory circuitry 1435 may provide memory and storage for integrated system 1410 including image and/or video data for display by display device, processor circuitry 1440 may provide high level control for mobile computing platform 1405 as well as operations corresponding to generating image and/or video data for display by display device, and communications circuitry 1445 may transmit and/or receive data including image and/or video data for display by display device. For example, communications circuitry 1445 may be coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 15:
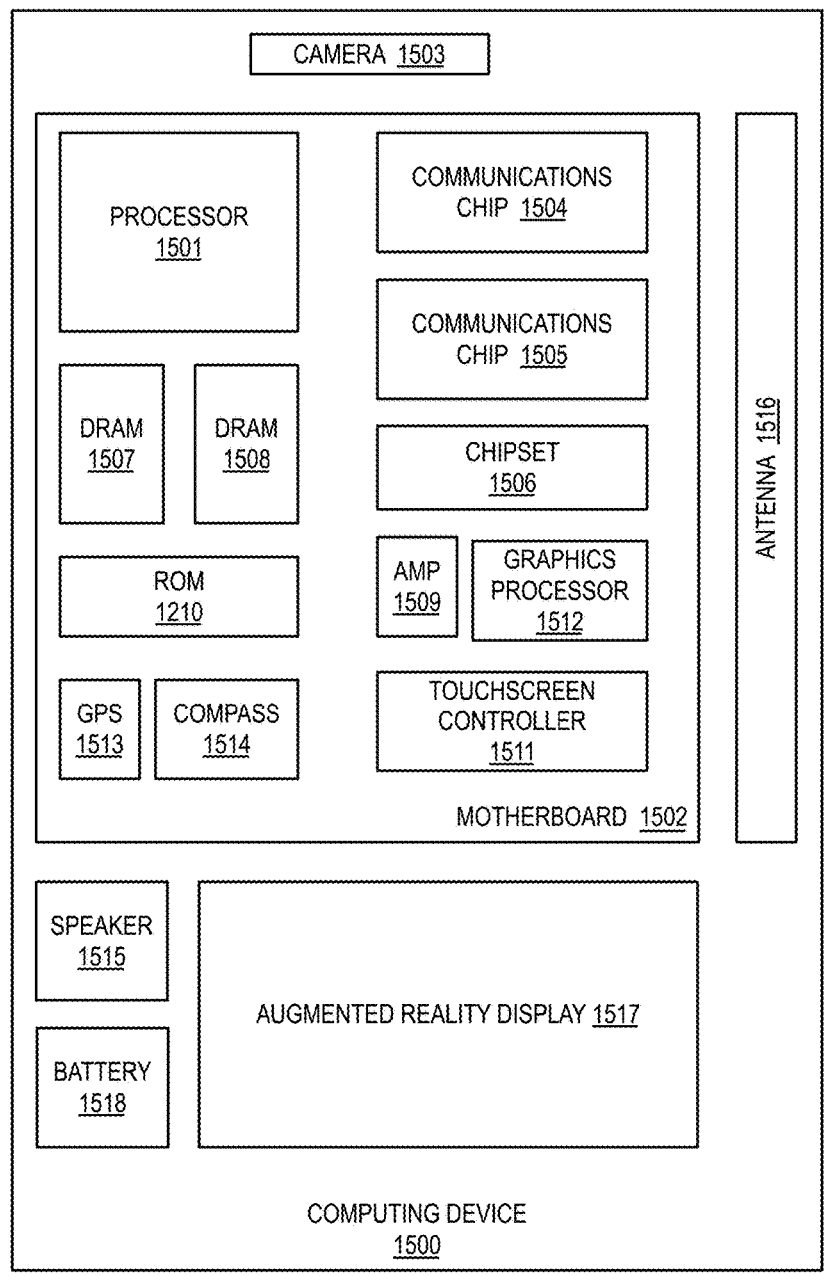
FIG. 15 is a functional block diagram of a computing device, arranged in accordance with at least some embodiments.

FIG. 15 is a functional block diagram of a computing device 1500, arranged in accordance with at least some implementations of the present disclosure. Computing device 1500 or portions thereof may be implemented in AR platform 1400, for example. Computing device 1500 further includes a motherboard 1502 hosting a number of components, such as, but not limited to, a processor 1501 (e.g., an applications processor, a microprocessor, etc.) and one or more communications chips 1504, 1505. Processor 1501 may be physically and/or electrically coupled to motherboard 1502. In some examples, processor 1501 includes an integrated circuit die packaged within the processor 1501. In general, the term "processor" may refer to any device or portion of a device that processes electronic data from registers and/or memory to transform that electronic data into other electronic data that may be stored in registers and/or memory.

In various examples, one or more communication chips 1504, 1505 may also be physically and/or electrically coupled to the motherboard 1502. In further implementations, communication chips 1504 may be part of processor 1501. Depending on its applications, computing device 1500 may include other components that may or may not be physically and electrically coupled to motherboard 1502. These other components may include, but are not limited to, volatile memory (e.g., DRAM) 1507, 1508, non-volatile memory (e.g., ROM) 1510, a graphics processor 1512, flash memory, global positioning system (GPS) device 1513, compass 1514, a chipset 1506, an antenna 1516, a power amplifier 1509, a touchscreen controller 1511, a touchscreen display 1517, a speaker 1515, a camera 1503, and a battery 1518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. For example, touchscreen display 1517 may implement any emissive display device structure(s).

Communication chips 1504, 1505 may enable wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1504, 1505 may implement any of a number of wireless standards or protocols, including but not limited to those described elsewhere herein. As discussed, computing device 1500 may include a plurality of communication chips 1504, 1505. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, one or both of communication chips 1504, 1505 may provide a wireless transceiver for computing device 1500. AR display 1517 of computing device 1500 may include or utilize one or more optical element with a multi-level metasurface, for example as described elsewhere herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In first examples, an optical element comprises a plurality of first nanostructures spatially distributed over an area of a substrate, wherein the substrate and the first nanostructures are transmissive over a visible light band, and wherein the first nanostructures have dimensions that induce a phase shift of a first non-zero magnitude for a first wavelength within the band. The optical element comprises a dielectric material over and between the first nanostructures, wherein the dielectric material is transmissive over the band. The optical element comprises a plurality of second nanostructures over the first nanostructures with the dielectric material therebetween. The second nanostructures are transmissive over the band and have dimensions that induce a phase shift of at least the first magnitude for a second wavelength within the band, and wherein the first and second wavelengths differ by at least 50 nm.

In second examples, for any of the first examples the dielectric material is a first dielectric material, and the element further comprises a second dielectric material over the second nanostructures. The element further comprises a plurality of third nanostructures over the second nanostructures with the second dielectric material therebetween. The third nanostructures are transmissive over the band and have dimensions that induce a phase shift of at least the first magnitude for a third wavelength of the band. The third wavelength differs from both the first and second wavelengths by at least 50 nm. The first wavelength is a center wavelength of a first of a red, green and blue wavelength band. The second wavelength is a center wavelength of a second of the red, green and blue wavelength band. The third wavelength is a center wavelength of a third of the red, green and blue wavelength band.

In third examples, for any of the second examples the optical element further comprising a third dielectric material over the third nanostructures.

In fourth examples, for any of the second examples the first dielectric material has a first index contrast with the first nanostructures at the first wavelength, and a second index contrast with the first nanostructures at the second wavelength. The second dielectric material has a third index contrast with the second nanostructures at the second wavelength. A difference between the first and second contrasts is greater than a difference between the first and third contrasts.

In fifth examples, for any of the first through fourth examples the first nanostructures have a lateral dimension parallel to a plane of the substrate, and the lateral dimension of the first nanostructures spans a first range from a first minimum lateral dimension to a first maximum lateral dimension. The second nanostructures have a lateral dimension parallel to the plane of the substrate, and the lateral dimension of the second nanostructures spans a second range from a second minimum lateral dimension to a second maximum lateral dimension, wherein at least the first minimum lateral dimension is different than the second minimum lateral dimension.

In sixth examples, for any of the fifth examples the first minimum lateral dimension is less than the second minimum lateral dimension and the first maximum lateral dimension is no greater than the second minimum lateral dimension, or the second minimum lateral dimension is less than the first minimum lateral dimension and the second maximum lateral dimension is no greater than the first minimum lateral dimension.

In seventh examples, for any of the fifth through the sixth examples the first nanostructures have a first height, orthogonal to the plane of the substrate, the second nanostructure have a second height, orthogonal to the plane of the substrate, different than the first height.

In eighth examples, for any of the seventh examples, the first wavelength is longer than the second wavelength, the first height is greater than the second height, and the first minimum lateral dimension is greater than the second minimum later dimension. Alternatively, the second wavelength is longer than the first wavelength, the second height is greater than the first height, and the second minimum lateral dimension is greater than the first minimum lateral dimension.

In ninth examples, for any of the eighth examples the first wavelength is at least 600 nm, the first height is at least 420 nm, and the first minimum lateral dimension is no less than 90 nm. The second wavelength is at least 500 nm, the second height is at least 350 nm, and the second maximum lateral dimension is no more than 90 nm.

In tenth examples, for any of the first through the ninth examples the optical element is a converging lens, the first nanostructures have a spatial distribution over the substrate area that focuses the first wavelength, to a focal point at a first focal length, and the second nanostructures have a spatial distribution over the substrate area that focuses the second wavelength, to the focal point at the first focal length.

In eleventh examples, for any of the first through the tenth examples the first nanostructures, the second nanostructures, or both the first and second nanostructures further comprise at least one of: a compound comprising at least titanium and oxygen, a compound comprising at least silicon and nitrogen, a compound comprising at least hafnium and oxygen, a compound comprising at least gallium and phosphorus, crystalline diamond, or diamond-like carbon.

In twelfth examples, for any of the first through the eleventh examples the first nanostructures, the second nanostructures, or both the first and second nanostructures comprise a core of a first composition and a cladding, of a second composition, over at least a sidewall of the core.

In thirteenth examples, for any of the twelfth examples the cladding has a thickness less than 50 nm and comprises at least one of titanium oxide, crystalline or amorphous gallium phosphide, crystalline diamond, or diamond-like carbon.

In fourteenth examples, a display device comprises a light source operable to emit visible light. An optical element to couple the visible light to a viewport. The optical element comprises a plurality of first nanostructures spatially distributed over an area of a substrate that is within an optical path of the visible light. The substrate and the first nanostructures are transmissive to the visible light. The first nanostructures have dimensions that induce a phase shift of a first non-zero magnitude for a center wavelength of a first of a red, blue or green wavelength band. The optical element comprises a first dielectric material over the first nanostructures. The first dielectric material is transmissive of the visible light. The optical element comprises a plurality of second nanostructures over the first nanostructures with the dielectric material therebetween. The second nanostructures are transmissive of the visible light and have dimensions that induce a phase shift of at least the first magnitude for a center wavelength of a second of the red, blue or green wavelength band. The optical element comprises a second dielectric material over the second nanostructures, wherein second dielectric material is transmissive of the visible light. The optical element comprises a plurality of third nanostructures over the second nanostructures with the second dielectric material therebetween. The third nanostructures are transmissive of the visible light and have dimensions that induce a phase shift of at least the first magnitude for a center wavelength of a third of the red, blue or green wavelength band. The display device comprises one or more processors to receive image data and control the light source based on the image data.

In fifteenth examples, for any of the fourteenth examples the display device comprises a battery, a memory, and a wireless communications system coupled to at least one of the memory and the processor to receive the image data from a source remote from the display device.

In sixteenth examples, a method of fabricating an optical element comprises forming a plurality of first nanostructures over an area of a substrate, wherein the substrate and the first nanostructures are transmissive over a light band, and wherein the first nanostructures have dimensions that induce a phase shift of a first non-zero magnitude for a first wavelength within the band. The method comprises forming a dielectric material over the first nanostructures. The dielectric material is transmissive over the band. The method comprises forming a plurality of second nanostructures over the dielectric material and the first nanostructures. The second nanostructures are transmissive over the band and have dimensions that induce a phase shift of at least the first magnitude for a second wavelength within the band, wherein the first and second wavelengths differ by at least 50 nm.

In seventeenth examples, for any of the sixteenth examples forming the first nanostructures further comprises forming a mold in a first substrate, the mold comprising a negative pattern of the first nanostructures. The method comprises depositing a release layer over the mold, depositing a metamaterial over the release layer, the metamaterial backfilling the negative pattern, planarizing a top surface of the metamaterial, and bonding the first substrate to a second substrate with the planarized surface of the metamaterial facing an interface of the bond. The second substrate is transmissive over the visible light band. The method comprises exposing the release layer to UV radiation transmitted through one or more of the first and second substrates, and separating the metamaterial from the mold.

In eighteenth examples, for any of the sixteenth or seventeenth examples forming the plurality of second nanostructures over the dielectric material and the first nanostructures further comprises forming a second mold in a third substrate, the second mold comprising a negative pattern of the second nanostructures, conformally depositing a second release layer over the second mold, depositing a second metamaterial layer over the second release layer, the second metamaterial layer backfilling the negative pattern of the second nanostructures, planarizing a top surface of the second metamaterial layer, bonding the third substrate to the second substrate with the planarized surface of the second metamaterial layer facing an interface of the bond, exposing the second release layer to UV radiation transmitted through one or more of the second and third substrates, and separating the second metamaterial layer from the second mold.

In nineteenth examples, for any of the sixteenth through eighteenth examples the method comprises forming a second dielectric material over the second nanostructures, wherein the second dielectric material is transmissive over the band, and forming a plurality of third nanostructures over the second dielectric material and the second nanostructures, wherein the third nanostructures are transmissive over the band and have dimensions that induce a phase shift of at least the first magnitude for a third wavelength within the band, wherein the third wavelength differs from the first and second wavelengths by at least 50 nm.

In twentieth examples, for any of the nineteenth examples forming the plurality of third nanostructures over the second dielectric material and the second nanostructures further comprises forming a third mold in a fourth substrate, the third mold comprising a negative pattern of the third nanostructures, depositing a third release layer over the third mold, depositing a third metamaterial layer over the third release layer, the third metamaterial layer backfilling the negative pattern of the third nanostructures, planarizing a top surface of the third metamaterial layer, bonding the fourth substrate to the second substrate with the planarized surface of the third metamaterial layer facing an interface of the bond, exposing the third release layer to UV radiation transmitted through one or more of the second and fourth substrates, and separating the metamaterial from the third mold.

In twenty-first examples, for any of the sixteenth through twentieth examples the release layer comprises silicon.

In twenty-second examples, for any of the sixteenth through twenty-first examples depositing the release layer further comprises depositing less than 10 nm of silicon by atomic layer deposition.

In twenty-third examples, for any of the eighteenth examples the second substrate comprises a bond layer having the same composition as at least a surface of the second nanostructures, and bonding the first substrate to the second substrate further comprises bonding the planarized surface of the second metamaterial layer to the bond layer on the second substrate.

In twenty-fourth examples, for any of the sixteenth through twenty-third examples the metamaterial comprises at least one of titanium oxide, silicon nitride, or hafnium oxide.

In twenty-fifth examples, for any of sixteenth through twenty-third examples forming the dielectric material over the first nanostructures further comprises backfilling spaces between the first nanostructures with the dielectric material, and covering a top surface of the first nanostructures with the dielectric material, the wherein forming the dielectric material over the first nanostructures further comprises planarizing a top surface of the dielectric material.

In twenty-sixth examples, a method of fabricating an optical element comprises forming a mold in a first substrate, the mold comprising a negative pattern of first nanostructures. The method comprises depositing a release layer over the mold, depositing a metamaterial over the release layer, the metamaterial backfilling the negative pattern, planarizing a top surface of the metamaterial, bonding the first substrate to a second substrate with the planarized surface of the metamaterial facing an interface of the bond. The method comprises exposing the release layer to UV radiation transmitted through one or more of the first and second substrates, and separating the metamaterial from the mold.

In twenty-seventh examples, for any of the twenty-sixth examples the method comprises forming a dielectric material over the metamaterial, and forming a second metamaterial over the dielectric material. Forming the second metamaterial over the dielectric material further comprises forming a second mold in a third substrate, the second mold comprising a negative pattern of second nanostructures, conformally depositing a second release layer over the second mold, depositing the second metamaterial over the second release layer, the second metamaterial backfilling the negative pattern of the second nanostructures, planarizing a top surface of the second metamaterial, bonding the third substrate to the second substrate with the planarized surface of the metamaterial facing an interface of the bond, exposing the second release layer to UV radiation transmitted through one or more of the second and third substrates, and separating the second metamaterial from the second mold.

In twenty-eighth examples, for any of the twenty-seventh examples the method further comprises forming a second dielectric material over the second metamaterial, and forming a third metamaterial over the second dielectric material.

It will be recognized that the embodiments is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An optical element, comprising:
a plurality of first nanostructures spatially distributed over an area of a substrate, wherein the substrate and the first nanostructures are transmissive over a visible light band, and wherein the first nanostructures have dimensions that induce a phase shift of a first non-zero magnitude for a first wavelength within the band;
a dielectric material over and between the first nanostructures, wherein the dielectric material is transmissive over the band;
a plurality of second nanostructures over the first nanostructures with the dielectric material therebetween, wherein the second nanostructures are transmissive over the band and have dimensions that induce a phase shift of at least the first magnitude for a second wavelength within the band, and wherein the first and second wavelengths differ by at least 50 nm.

2. The optical element of claim 1, wherein the dielectric material is a first dielectric material, and the element further comprises:
a second dielectric material over the second nanostructures; and
a plurality of third nanostructures over the second nanostructures with the second dielectric material therebetween, wherein the third nanostructures are transmissive over the band and have dimensions that induce a phase shift of at least the first magnitude for a third wavelength of the band, wherein:
the first wavelength is a center wavelength of a first of a red, green and blue wavelength band;
the second wavelength is a center wavelength of a second of the red, green and blue wavelength band; and
the third wavelength is a center wavelength of a third of the red, green and blue wavelength band.

3. The optical element of claim 2, further comprising a third dielectric material over the third nanostructures.

4. The optical element of claim 2, wherein:
the first dielectric material has a first index contrast with the first nanostructures at the first wavelength, and a second index contrast with the first nanostructures at the second wavelength;
the second dielectric material has a third index contrast with the second nanostructures at the second wavelength; and
a difference between the first and second contrasts is greater than a difference between the first and third contrasts.

5. The optical element of claim 1, wherein:
the first nanostructures have a lateral dimension parallel to a plane of the substrate, and the lateral dimension of the first nanostructures spans a first range from a first minimum lateral dimension to a first maximum lateral dimension;
the second nanostructures have a lateral dimension parallel to the plane of the substrate, and the lateral dimension of the second nanostructures spans a second range from a second minimum lateral dimension to a second maximum lateral dimension, wherein at least the first minimum lateral dimension is different than the second minimum lateral dimension.

6. The optical element of claim 5, wherein:
the first minimum lateral dimension is less than the second minimum lateral dimension and the first maximum lateral dimension is no greater than the second minimum lateral dimension; or
the second minimum lateral dimension is less than the first minimum lateral dimension and the second maximum lateral dimension is no greater than the first minimum lateral dimension.

7. The optical element of claim 5, wherein:
the first nanostructures have a first height, orthogonal to the plane of the substrate; and
the second nanostructures have a second height, orthogonal to the plane of the substrate, different than the first height.

8. The optical element of claim 7, wherein:
the first wavelength is longer than the second wavelength, the first height is greater than the second height, and the first minimum lateral dimension is greater than the second minimum lateral dimension; or
the second wavelength is longer than the first wavelength, the second height is greater than the first height, and the second minimum lateral dimension is greater than the first minimum lateral dimension.

9. The optical element of claim 8, wherein:
the first wavelength is at least 600 nm, the first height is at least 420 nm, and the first minimum lateral dimension is no less than 90 nm; and
the second wavelength is at least 500 nm, the second height is at least 350 nm, and the second maximum lateral dimension is no more than 90 nm.

10. The optical element of claim 1, wherein:
the optical element is a converging lens, and
the first nanostructures have a spatial distribution over the substrate area that focuses the first wavelength, to a focal point at a first focal length; and
the second nanostructures have a spatial distribution over the substrate area that focuses the second wavelength, to the focal point at the first focal length.

11. The optical element of claim 1, wherein the first nanostructures, the second nanostructures, or both the first and second nanostructures further comprise at least one of: a compound comprising at least titanium and oxygen, a compound comprising at least silicon and nitrogen, a compound comprising at least hafnium and oxygen, a compound comprising at least gallium and phosphorus, crystalline diamond, or diamond-like carbon.

12. The optical element of claim 1, wherein the first nanostructures, the second nanostructures, or both the first and second nanostructures comprise a core of a first composition and a cladding, of a second composition, over at least a sidewall of the core.

13. The optical element of claim 12, wherein the cladding has a thickness less than 50 nm and comprises at least one of titanium oxide, crystalline or amorphous gallium phosphide, crystalline diamond, or diamond-like carbon.

14. A display device, comprising:
a light source operable to emit visible light;
an optical element to couple the light to a viewport, wherein the optical element comprises:
a plurality of first nanostructures spatially distributed over an area of a substrate that is within an optical path of the light, wherein the substrate and the first nanostructures are transmissive of light, and wherein the first nanostructures have dimensions that induce a phase shift of a first non-zero magnitude for a center wavelength of a first of a red, blue or green wavelength band;
a first dielectric material over the first nanostructures, wherein first dielectric material is transmissive of the light;
a plurality of second nanostructures over the first nanostructures with the dielectric material therebetween, wherein the second nanostructures are transmissive of the light and have dimensions that induce a phase shift of at least the first magnitude for a center wavelength of a second of the red, blue or green wavelength band;
a second dielectric material over the second nanostructures, wherein second dielectric material is transmissive of the light;
a plurality of third nanostructures over the second nanostructures with the second dielectric material therebetween, wherein the third nanostructures are transmissive of the light and have dimensions that induce a phase shift of at least the first magnitude for a center wavelength of a third of the red, blue or green wavelength band; and
one or more processors to receive image data and control the light source based on the image data.

15. The display device of claim 14, further comprising:
a battery;
a memory; and
a wireless communications system coupled to at least one of the memory and the processor to receive the image data from a source remote from the display device.

16. A method of fabricating an optical element, the method comprising:
forming a plurality of first nanostructures over an area of a substrate, wherein the substrate and the first nanostructures are transmissive over a light band, and wherein the first nanostructures have dimensions that induce a phase shift of a first non-zero magnitude for a first wavelength within the band;
forming a dielectric material over the first nanostructures, wherein the dielectric material is transmissive over the band; and
forming a plurality of second nanostructures over the dielectric material and the first nanostructures, wherein the second nanostructures are transmissive over the band and have dimensions that induce a phase shift of at least the first magnitude for a second wavelength within the band, wherein the first and second wavelengths differ by at least 50 nm.

17. The method of claim 16, wherein forming the first nanostructures further comprises:

forming a mold in a first substrate, the mold comprising a negative pattern of the first nanostructures;
depositing a release layer over the mold;
depositing a metamaterial over the release layer, the metamaterial backfilling the negative pattern;
planarizing a top surface of the metamaterial;
bonding the first substrate to a second substrate with the planarized surface of the metamaterial facing an interface of the bond, wherein the second substrate is transmissive over the visible light band;
exposing the release layer to UV radiation transmitted through one or more of the first and second substrates; and
separating the metamaterial from the mold.

18. The method of claim 17, wherein forming the plurality of second nanostructures over the dielectric material and the first nanostructures further comprises:
forming a second mold in a third substrate, the second mold comprising a negative pattern of the second nanostructures;
conformally depositing a second release layer over the second mold;
depositing a second metamaterial layer over the second release layer, the second metamaterial layer backfilling the negative pattern of the second nanostructures;
planarizing a top surface of the second metamaterial layer;
bonding the third substrate to the second substrate with the planarized surface of the second metamaterial layer facing an interface of the bond;
exposing the second release layer to UV radiation transmitted through one or more of the second and third substrates; and
separating the second metamaterial layer from the second mold.

19. The method of claim 18, further comprising:
forming a second dielectric material over the second nanostructures, wherein the second dielectric material is transmissive over the band; and
forming a plurality of third nanostructures over the second dielectric material and the second nanostructures, wherein the third nanostructures are transmissive over the band and have dimensions that induce a phase shift of at least the first magnitude for a third wavelength within the band, wherein the third wavelength differs from the first and second wavelengths by at least 50 nm.

20. The method of claim 19, wherein forming the plurality of third nanostructures over the second dielectric material and the second nanostructures further comprises:
forming a third mold in a fourth substrate, the third mold comprising a negative pattern of the third nanostructures;
depositing a third release layer over the third mold;
depositing a third metamaterial layer over the third release layer, the third metamaterial layer backfilling the negative pattern of the third nanostructures;
planarizing a top surface of the third metamaterial layer;
bonding the fourth substrate to the second substrate with the planarized surface of the third metamaterial layer facing an interface of the bond;
exposing the third release layer to UV radiation transmitted through one or more of the second and fourth substrates; and
separating the metamaterial from the third mold.

21. The method of claim 18, wherein the second substrate comprises a bond layer having the same composition as at least a surface of the second nanostructures, and bonding the first substrate to the second substrate further comprises bonding the planarized surface of the second metamaterial layer to the bond layer on the second substrate.

22. The method of claim 21, wherein the metamaterial comprises at least one of titanium oxide, silicon nitride, or hafnium oxide.

23. The method of claim 17, wherein forming the dielectric material over the first nanostructures further comprises backfilling spaces between the first nanostructures with the dielectric material, and covering a top surface of the first nanostructures with the dielectric material, wherein forming the dielectric material over the first nanostructures further comprises planarizing a top surface of the dielectric material.

24. The method of claim 16, wherein the release layer comprises silicon.

25. The method of claim 24, wherein depositing the release layer further comprises depositing less than 10 nm of silicon by atomic layer deposition.

26. A method of fabricating an optical element, the method comprising:
forming a mold in a first substrate, the mold comprising a negative pattern of first nanostructures;
depositing a release layer over the mold;
depositing a metamaterial over the release layer, the metamaterial backfilling the negative pattern;
planarizing a top surface of the metamaterial;
bonding the first substrate to a second substrate with the planarized surface of the metamaterial facing an interface of the bond;
exposing the release layer to UV radiation transmitted through one or more of the first and second substrates; and
separating the metamaterial from the mold.

27. The method of claim 26, further comprising:
forming a dielectric material over the metamaterial; and
forming a second metamaterial over the dielectric material, wherein forming the second metamaterial over the dielectric material further comprises:
forming a second mold in a third substrate, the second mold comprising a negative pattern of second nanostructures;
conformally depositing a second release layer over the second mold;
depositing the second metamaterial over the second release layer, the second metamaterial backfilling the negative pattern of the second nanostructures;
planarizing a top surface of the second metamaterial;
bonding the third substrate to the second substrate with the planarized surface of the metamaterial facing an interface of the bond;
exposing the second release layer to UV radiation transmitted through one or more of the second and third substrates; and
separating the second metamaterial from the second mold.

28. The method of claim 27, further comprising:
forming a second dielectric material over the second metamaterial; and
forming a third metamaterial over the second dielectric material.

* * * * *